March 26, 1968 D. P. BURKS ET AL 3,374,533
SEMICONDUCTOR MOUNTING AND ASSEMBLY METHOD
Filed May 26, 1965 2 Sheets-Sheet 1
Fig. 2.
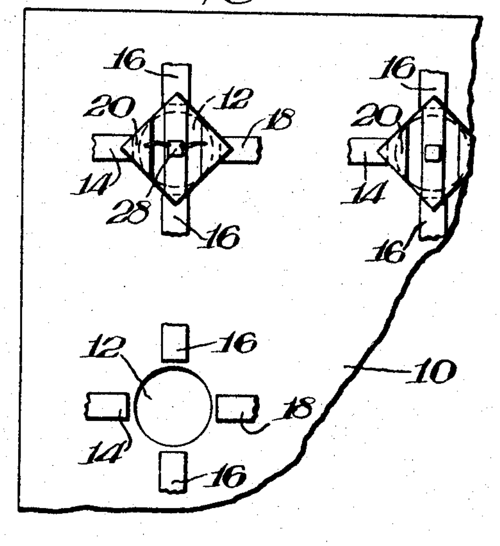
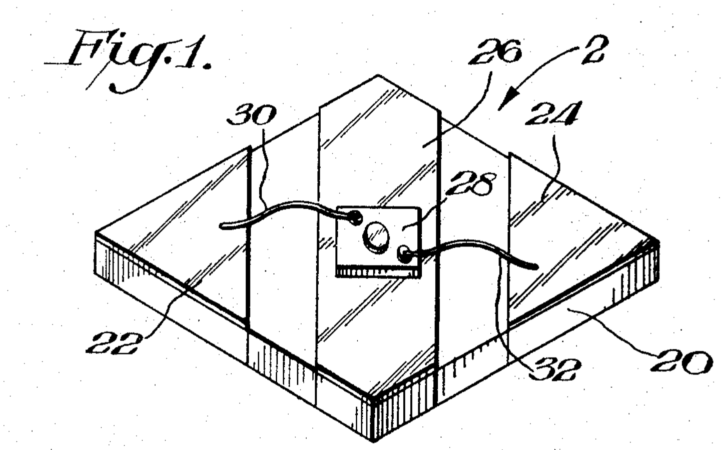
Fig. 4.
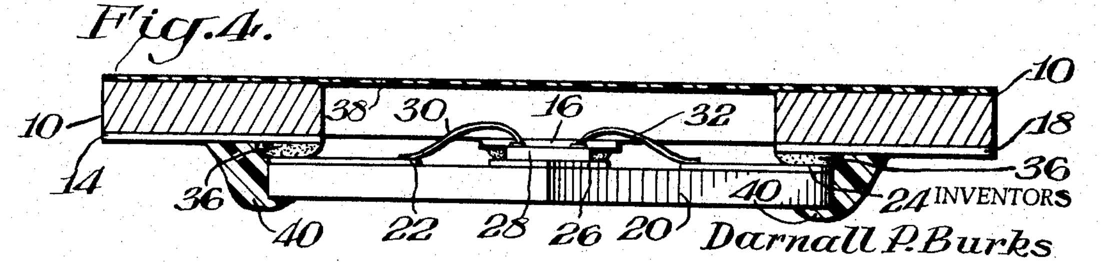
INVENTORS
Darnall P. Burks
John H. Fabricius
BY Connolly and Hutz
ATTORNEYS INVENTORS
Darnall P. Burks
John H. Fabricius
BY Connolly and Hutz
ATTORNEYS United States Patent Office 3,374,533
Patented Mar. 26, 1968

3,374,533
SEMICONDUCTOR MOUNTING AND ASSEMBLY METHOD

Darnall P. Burks, Williamstown, Mass., and John H. Fabricius, Stamford, Vt., assignors to Sprague Electric Company, North Adams, Mass., a corporation of Massachusetts Filed May 26, 1965, Ser. No. 458,930
5 Claims. (Cl. 29—577)

ABSTRACT OF THE DISCLOSURE

A semiconductor device is mounted on a mounting chip of insulating material. Elements of the semiconductor device are in electrical contact with spaced discrete conductive pads on the mounting chip. The mounting chip is secured to a circuit substrate with the conductive pads in conductive contact with circuit lands on the substrate.

The present invention relates to mounting an assembly of semiconductor devices and more particularly to semiconductor mounting and assembly methods.

Present mounting arrangements for semiconductor devices, such as diodes, transistors or integrated circuit units, on circuit substrates are subject to a number of disadvantages. For example, these arrangements can not be safely handled for inspection, etc. Additionally, these arrangements do not provide for the high frequency testing and matching of characteristics of the device before it is assembled to the circuit substrate. Moreover, the leads connected to the device are not readily protected and are also relatively long. As a result of the length of the leads, the lead inductance is high and there are power losses which are associated with ferromagnetic packaging materials. Finally, these arrangements do not lend themselves to automated assembly.

An object of this invention is to provide a semiconductor mounting and assembly method which overcomes the above indicated disadvantages.

Novel features and advantages of the present invention will become apparent to one skilled in the art from a reading of the following description in conjunction with the accompanying drawings wherein similar reference characters refer to similar parts and in which:

FIGURE 1 is a perspective view of a mounting chip assembly;

FIGURE 2 is a plan view of a circuit substrate with mounting chip assemblies of FIGURE 1 in various stages of attachment;

FIGURE 4 is a plan view of another embodiment of this invention;

Figure 3:
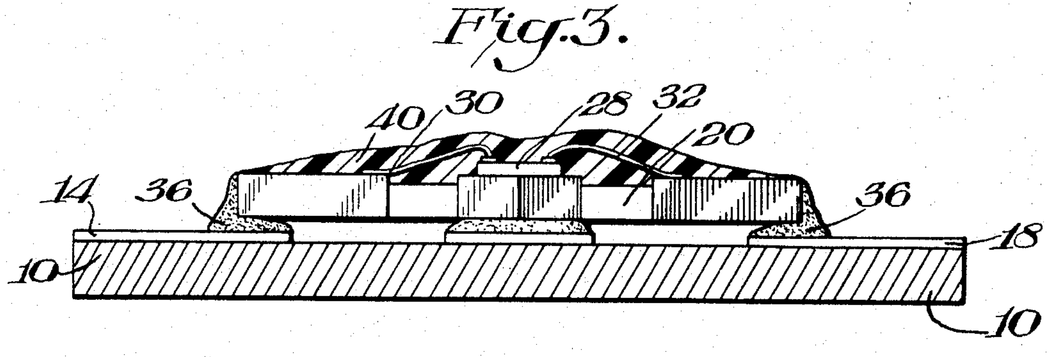
FIGURE 3 is an elevational view partly in section of one of the assemblies shown in FIGURE 2.

In general this invention involves mounting at least one semiconductor device, e.g., a diode, transistor or integrated circuit unit, on a mounting chip having a plurality of conductive pads. The semiconductor is secured on the chip with its elements connected to the pads. This provides a convenient assembly which allows for safe handling for inspection, provides means for high frequency testing and matching of the device before its assembly to the circuit substrate, and provides convenient terminals for electrical test purposes. Additionally, any leads of the semiconductor are protected because they are confined within the bounds of the mounting chip.

FIGURE 1 shows a chip assembly 2 having a semiconductor 28 such as a transistor or the like attached to a mounting chip 20 in connection to metallized areas or pads. The mounting chip 20 is made of insulating material such as glass, alumina, beryllia or other ceramic. One corner of mounting chip 20 is provided with a metallized pad 22 and the opposite corner is provided with a similar pad 24 while an intermediate pad 26 extends diagonally across plate or chip 20 between pads 22 and 24. Pads 22, 24 and 26 are applied to chip 20 by silk screening, evaporating, plating, lamination, or other suitable means. The pads are produced in this embodiment by depositing molybdenum-manganese on the pad areas of the chip 20 and plating with nickel or gold.

The semiconductor 28 is secured to mounting chip 20 by, for example, brazing or soldering the collector of semiconductor 28 to pad 26. The semiconductor 28 is also in conductive relationship with metallized areas 22 and 24 by a pair of leads 30 and 32 respectively which connect emitter and base regions of semiconductor 28 to the pads. For chip assemblies which will be subjected to handling, storage or shipping, etc., it is desirable to seal the device 28, at this time, to the chip 20 by a sealing coat of epoxy or the like. The coating may also be applied at later stages as shown in FIGURES 3 and 4. Accordingly, mounting chip 20 and its semiconductor 28 provide a convenient assembly which allows for safe handling for inspection, etc., and also provides means for high frequency testing and matching of devices before this assembly is made available for circuit use. Moreover the mounting chip 20 protects the leads 30 and 32 since they are contained within the bounds of the chip. Chip 20 also provides good terminals for electrical test purposes. Additionally, this arrangement reduces the lead length thereby reducing lead inductance and eliminating power losses associated with ferromagnetic packaging material. The uniformity and polarization of shape of chip 20 also permits automated assembly of the chips to the substrate.

As shown in FIGURE 1 the metallized areas occupy a substantial portion of the top surface of chip 20. For example, chip 20 is a square 0.060 inch long on each side. Pads 22 and 24 are made in the form of isosceles triangles which have a pair of sides 0.020 inch long. The central pad 26 has parallel sides which begin 0.015 inch from the corner of chip 20.

The metallizing is brought over the edge in the preferred embodiment to facilitate the making of circuit connections when the chip assembly is mounted on a circuit substrate in the upright position as shown in FIGURE 2.

Referring now to FIGURE 2 wherein is shown a circuit substrate 10 having a plurality of chip assemblies 2 in connection to circuit contacts or lands 14, 16 and 18.

The circuit substrate 10 is made of an insulating material similar to chip 20 and circuit lands 14, 16 and 18 are deposited by a suitable means similar to those described for the pads of chip 20.

Advantageously, as shown in FIGURE 3, pads 22, 24 and 26 of chip 20 are secured to their respective circuit lands 14, 16 and 18 by, for example, a layer of soldering material 36 to effectively attach chip 20 and substrate 10 together with semiconductor 28 mounted in an upright position. A sealing coat 40 of epoxy, or the like may be utilized to seal the chip 20 to the circuit substrate, however, this is unnecessary in those cases where the described for the pads of chip 20.

The upright position of the mounting chip 2 requires that the pads of chip 20 be extended to provide conductive relationship with elements 14, 16 and 18 on substrate 10. This can be accomplished for example in one of two ways. In the first method, metallized pads identical to pads 22, 24 and 26 are formed on the opposite side of chip 20 and the metallized pads on each side of chip 20 are joined by a metallized area on the edge of the chip. Accordingly, the metallized pads of the side of chip 20 opposite semiconductor 28 can be mounted directly on circuit lands 14, 16 and 18 of circuit substrate 10 and semiconductor 28 will be in conductive relationship with circuit lands 14, 16 and 18.

In an alternative method, the edges of chip 20 adjacent metallized pads 22, 24 and 26 are conductively coated. The metallized pads are then in a conductive relationship with circuit lands 14, 16 and 18 either by these lands contacting the lower ends of the metallized edges or through their connection to the edges by conductive soldering material. After chip 20 is secured to circuit substrate 10 with semiconductor 28 in upright position, the semiconductor 28 and chip 20 may be coated with a sealing coating 40 of epoxy or the like.

FIGURE 4 shows an alternative method of connecting the chip assembly 2 to the circuit. This modification differs from that shown in FIGURE 3 in that the chip assembly is attached in inverted position with the semiconductor 28 within an opening 12 of the substrate 10. The hole 12, for example, 0.12 inch in diameter is cut in substrate 10 and circuit lands 14, 16 and 18 are positioned around the periphery as seen in FIGURE 2. The chip is of sufficient size to cover the hole 12 with the chip pads 22, 24 and 26 connected to the appropriate circuit lands by solder 36. The chip 20 is sealed to the substrate 10 by a sealing coat 40 of epoxy or the like and the opposite side of the hole is sealed by any suitable sealing material 38. The sealing material 38 may, of course, be eliminated by providing a blind hole in circuit substrate 10.

Figure 5:
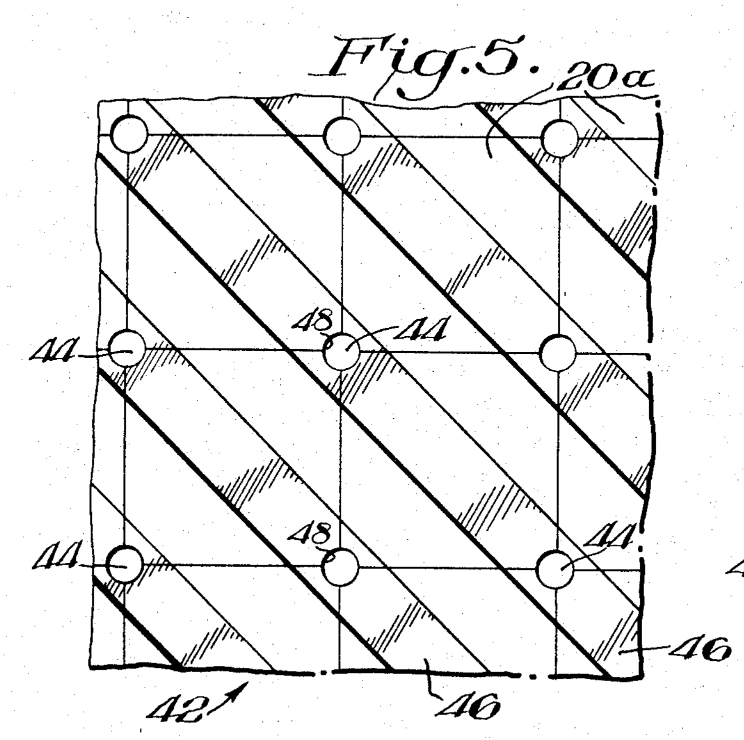
FIGURE 5 is a plan view of a blank used for forming the mounting chips shown in FIGURES 1–4.
Figure 6:
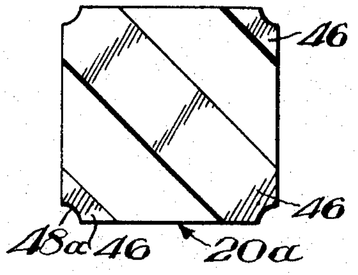
FIGURE 6 is a plan view of a mounting chip formed from the blank shown in FIGURE 5.
Figure 7:
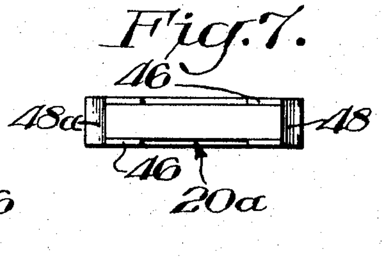
FIGURE 7 is a side view of the mounting chip shown in FIGURE 6.

FIGURES 5–7 show one method of forming mounting chips which are suitable for mounting the semiconductors in either an inverted or an upright position. FIGURE 5 shows a fragment of a blank 42 in the form of a sheet insulating material. Holes 44 are formed in sheet 42 being spaced apart a distance of 0.060 inch along parallel rows and columns. Metallized pads 46 are then applied diagonally across sheet 42 over each diagonal set of holes. By being applied across holes 44 the metallized material is permitted to contact the walls 48 of each hole. Sheet 42 is then cut or diced to form a plurality of mounting chips 20*a*.

FIGURES 6 and 7 show one of these mounting chips 20*a*. As indicated therein chip 20*a* includes a plurality of conductive pads 46 which correspond to pads 22, 24 and 26 of mounting chip 20 shown in FIGURES 1–5. The conductive material at the edges 48*a* of chip 20*a* permit the pads to be in conductive relationship with the circuit substrate. If desired, both sides of sheet 42 may have conductive pads 46 with opposing pads joined at the corners of the chip 20*a*.

In a further modification of this invention, a chip is provided which has three holes and in which metal balls, of, for example, gold, silver or platinum are mounted by suitable means to provide through contacts on the chip. Such balls may be secured to the chip by any suitable means such as, soldering or fusing the balls to the metallized walls of the holes or flattening or swaging the balls in place. In an alternative form gold or silver rivets may be employed. These chips having the metallized holes may also be formed from a blank similar to that shown in FIGURE 5 but differing in the hole pattern. For example, the holes may be formed in triangular patterns or each of said holes may include an enlarged central hole flanked by a pair of smaller corner holes. The semiconductor collector would then be secured on the ball or rivet pad of one of the holes such as the enlarged central hole and the emitter and base connected to the pads provided in the other holes.

Still further modifications of the chip assembly are possible. The metallized pads may be varied in a number of ways. For example, a long pad may be deposited along one edge of the chip joining two adjacent corners, with a separate pad on each remaining corner. Moreover the chip may be provided in circular or triangular shape with appropriate pads.

Obviously, many modifications and variations of the present invention are possible in the light of the above teachings. It is therefore, to be understood that within the scope of the appended claims the invention may be practiced otherwise than as specifically described.

What is claimed is:

1. A method of forming a semiconductor assembly comprising applying a plurality of discrete conductive pads on a mounting chip of insulating material, said conductive pads including a pair of pads at oppositely disposed corners of said mounting chip and an intermediate pad extending diagonally across said mounting chip and comprising at least one discrete conductive portion, mounting a semiconductor device on said chip with one element in conductive contact to said at least one portion, and applying leads in conductive contact between other elements of said semiconductor device and said pads, providing a circuit substrate having a first pair of oppositely disposed conductive lands and with another pair of oppositely disposed conductive lands between said first pair of lands, and securing said mounting chip upon said circuit substrate with said pair of corner pads in conductive contact to said first pair of lands and with said at least one portion of said intermediate pad in conductive contact with at least one of said another pair of lands.

2. A method of forming a semiconductor assembly comprising applying a plurality of discrete conductive pads on a mounting chip of insulating material, said conductive pads including a first pair of pads at oppositely disposed corners of said mounting chip and an intermediate pad extending diagonally across said mounting chip and connecting two intermediate corners of said chip, mounting a semiconductor device on said intermediate pad with one element in conductive contact thereto, and applying leads in conductive contact between other elements of said semiconductor device and said first pair of corner pads, providing a circuit substrate having a first pair of oppositely disposed conductive lands and with another pair of oppositely disposed conductive lands between said first pair of lands, and securing said mounting chip upon said circuit substrate with said first pair of corner pads in conductive contact to said first pair of lands and with said intermediate pad in conductive contact with said another pair of lands.

3. The method of claim 2 wherein said semiconductor device is disposed in an upright position with respect to said circuit substrate.

4. The method of claim 2 wherein said first pair of lands and said another pair of lands are disposed about the periphery of a hole in said circuit substrate, and said semiconductor device is disposed within said hole in an inverted position with respect to said circuit substrate.

5. A method of forming a semiconductor assembly comprising forming a plurality of holes in a sheet of insulated material with said holes being arranged in equally spaced parallel rows and columns, applying a plurality of parallel metallized pads diagonally on said sheet with each metallized pad intersecting a diagonal set of holes, permitting the metallized material from said metallized pads to be applied to the walls of said holes, cutting said sheet of insulated material into a plurality of square mounting chips, each of said mounting chips being defined by a set of four holes forming notched corners, whereby each mounting chip includes a metallized pad at oppositely disposed notched corners and an intermediate metallized pad diagonally across said mounting chip and between said corner pads, applying a semiconductor device to said intermediate pad with one element thereof in conductive contact with said intermediate pad, and connecting leads between other elements of said semiconductor device and each of said corner metallized pads whereby said semiconductor device is in conductive contact with each of said metallized pads.

References Cited

UNITED STATES PATENTS

| | | | |
|---|---|---|---|
| 3,021,461 | 2/1962 | Oakes | 317—235 |
| 3,072,832 | 1/1963 | Kilby | 317—235 |
| 3,148,438 | 9/1964 | Winter | 29—155.5 |
| 3,289,046 | 11/1966 | Carr | 317—101 |
| 3,292,240 | 12/1966 | McNutt | 29—155.5 |

WILLIAM I. BROOKS, *Primary Examiner.*

UNITED STATES PATENT OFFICE

CERTIFICATE OF CORRECTION

Patent No. 3,374,533 March 26, 1968

Darnall P. Burks et al.

It is certified that error appears in the above identified patent and that said Letters Patent are hereby corrected as shown below:

Column 3, line 5, cancel "scribed for the pads of chip 20." and insert -- vice 28 was initially sealed to the chip 20. --.

Signed and sealed this 29th day of July 1969.

(SEAL)
Attest:

Edward M. Fletcher, Jr.
Attesting Officer

WILLIAM E. SCHUYLER, JR.
Commissioner of Patents